United States Patent
Krupke (10) Patent No.: US 10,153,609 B2
(45) Date of Patent: Dec. 11, 2018

(54) GAN PUMPED RUBY LASER (71) Applicant: William F. Krupke, Pleasanton, CA (US)

(72) Inventor: William F. Krupke, Pleasanton, CA (US)

(73) Assignee: WFK LASERS, LLC, Pleasanton, CA (US)

( * ) Notice: Subject to any disclaimer, the term of this patent is extended or adjusted under 35 U.S.C. 154(b) by 0 days.

(21) Appl. No.: 15/664,883

(22) Filed: Jul. 31, 2017

(65) Prior Publication Data

US 2018/0041002 A1 Feb. 8, 2018

Related U.S. Application Data (60) Provisional application No. 62/494,410, filed on Aug. 8, 2016.

(51) Int. Cl.
| | |
|---|---|
| H01S 3/16 | (2006.01) |
| H01S 3/0941 | (2006.01) |
| G02F 1/355 | (2006.01) |
| H01S 3/109 | (2006.01) |
| H01S 3/11 | (2006.01) |
| H01S 3/0933 | (2006.01) |
| G02F 1/37 | (2006.01) |
| H01S 3/094 | (2006.01) |
| H01S 5/323 | (2006.01) |
| H01S 3/00 | (2006.01) |
| H01S 3/06 | (2006.01) |

(52) U.S. Cl.
CPC .......... *H01S 3/1636* (2013.01); *G02F 1/3551* (2013.01); *G02F 1/37* (2013.01); *H01S 3/0933* (2013.01); *H01S 3/0941* (2013.01); *H01S 3/109* (2013.01); *H01S 3/11* (2013.01); *H01S 3/1115* (2013.01); *H01S 3/1623* (2013.01); H01S 3/0092 (2013.01); H01S 3/0602 (2013.01); H01S 3/09415 (2013.01); H01S 3/094076 (2013.01); H01S 5/32341 (2013.01)

(58) Field of Classification Search
CPC .... H01S 3/1636; H01S 3/0933; H01S 3/0941; H01S 3/109; H01S 3/11; H01S 3/1115; G02F 1/3551; G02F 1/37
See application file for complete search history.

(56) References Cited

U.S. PATENT DOCUMENTS

| | | | |
|---|---|---|---|
| 8,498,316 B2 | 7/2013 | Karpushko | |
| 2004/0183088 A1* | 9/2004 | DenBaars | ............... H01L 33/08 257/102 |
| 2009/0285248 A1 | 11/2009 | Karpushko | |

OTHER PUBLICATIONS

W. Koechner Solid-State Laser Engineering, Winger-Verlag 3rd Edition, 1992, p. 116.

(Continued)

*Primary Examiner* — Armando Rodriguez
(74) *Attorney, Agent, or Firm* — John P. Wooldridge (57) ABSTRACT

A diode pumped solid state laser is provided which includes a ruby crystal optical gain medium and a high bandgap semiconductor laser diode (LD) or light emitting diode (LED) pump source to directly optically pump the gain medium. The high-bandgap semiconductor LD or LED is a semiconductor device whose chemical composition is chosen to provide output radiation at an approximate wavelength of ~405 nm. The ruby crystal produces laser output at the relatively short wavelength of ~694 nm.

28 Claims, 8 Drawing Sheets (56) References Cited

OTHER PUBLICATIONS

A. E. Siegman, An Introducton to Lasers and Masers, McGraw-Hill Book Company, 1971, p. 398.
Klastech-Karpushko Laser Technologies, GmbH, Dortmund, Germany, Product Sheet, "Crescendo CW Ruby Laser", Jun. 2009.
J. Piprek, IEEE Journal of Quantum Electronics, 53(1), 200104 (2017).

* cited by examiner

GAN PUMPED RUBY LASER

CROSS-REFERENCE TO RELATED APPLICATIONS

This application claims the benefit of U.S. Provisional Patent Application No. 62/494,410 titled "GaN PUMPED RUBY LASER," filed Aug. 8, 2016, incorporated herein by reference.

BACKGROUND OF THE INVENTION

Field of the Invention

The present invention relates to optically pumped ruby lasers, and more specifically, it relates to a high-bandgap GaN semiconductor laser diode (LD) or laser light emitting diode (LED) pumped ruby laser and additional enabled devices.

Description of Related Art

Figure 1:
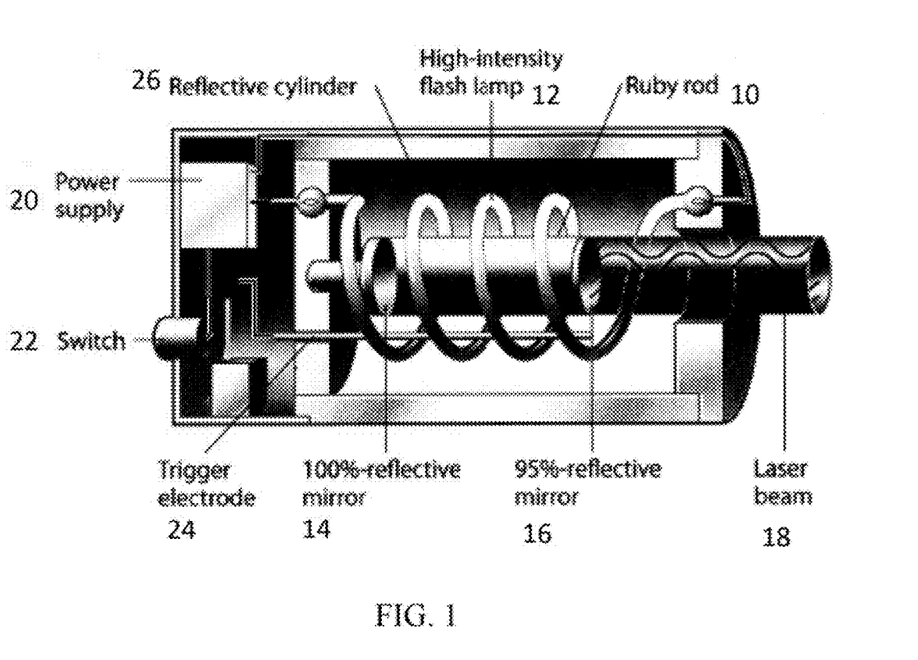
FIG. 1 is a drawing of the first ruby laser by Maiman.
Figure 2:
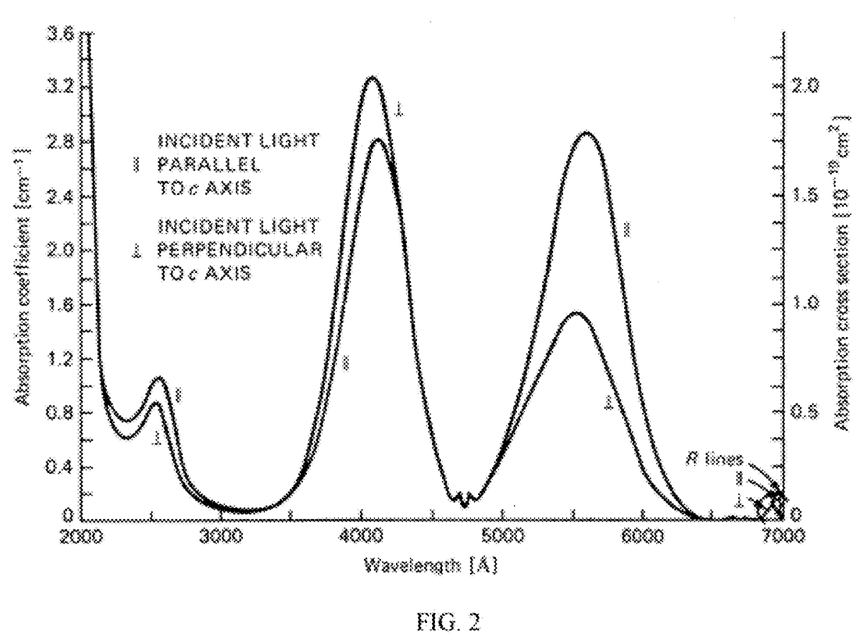
FIG. 2 shows the spectral absorption coefficient and cross section of ruby crystal, and the spectral absorption peaks of the ~405 nm and ~560 nm pump bands.

In 1960, T. Maiman demonstrated the first laser employing a ruby crystal (sapphire crystal doped with trivalent chromium ions) as the gain medium. As shown in FIG. 1, this first ruby laser consisted of a cylindrical ruby crystal rod 10 that was pulse pumped by a xenon flashlamp 12 to produce a population inversion and optical gain. The ends of the cylindrical rod were ground and polished flat. One end of the rod was coated with a silver mirror 14 reflecting nearly 100% at a wavelength of ~694 nm, while the other end was coated with a mirror 16 reflecting ~95% at ~694 nm. These two mirrors formed an optical cavity which resonated the light emitted by the pumped ruby crystal due to stimulated emission, resulting in laser beam 18 at the wavelength of ~694 nanometers. The figure additionally shows the power supply 20, switch 22 and trigger electrode 24 which together provide power to the flashlamp 12. The ruby rod 10 and flashlamp 12 are located within a reflective cylinder 26. The ruby crystal manifests two strong absorption bands at wavelengths peaked at ~405 nm and ~560 nm, as shown in FIG. 2. The ruby laser operates as a "three-level' laser whose upper laser level has the relatively long fluorescence lifetime of ~3 milliseconds at the wavelength of ~694 nm. The wavelength of the radiation emitted by a ruby laser depends on the temperature of the ruby gain crystal, varying from nominally 693.4 nm at a crystal temperature of −220 C to 694.9 nm at a temperature of +100 C. In this application, we designate the wavelength of the ruby laser as ~694 nm, indicating an operating temperature of the ruby laser gain element within this temperature range. The wavelength of second harmonic radiation produced by a ruby laser operating within this temperature range falls within the wavelength range of 346.7 and 347.5 nm, and is designated herein as ~347 nm. Given the broad spectral width of the ruby absorption band peaked at a wavelength of approximately 405 nm, the wavelength of the high bandgap semiconductor radiation source utilized to pump a ruby laser in the present application may reasonably possess a wavelength range from 390 nm to 420 nm, and will be designated by the wavelength ~405 nm.

Even with significant development during the following several decades, ruby laser device efficiencies remained less than 1%. Notwithstanding its low efficiency, the ruby gain crystal was first used to demonstrate and commercially exploit the technique of "Q-switching" to generate a high peak power, multi-megawatt optical pulse. The ruby laser has also been operated using the technique of "modelocking" to generate a train of high peak power pulses, each with durations of a few picoseconds.

Pulse ruby lasers were used for several decades in commercial applications that demanded a high energy, short pulse of red light: 1) in non-destructive testing by creating holograms of large objects such as aircraft tires to look for weaknesses in the lining; 2) in tattoo removal especially of certain types of blue-green tattoos; and 3) hair removal. Ruby lasers are rarely used today in industry and in medical procedures, mainly due to their relatively low efficiency and low repetition rates. Significant increases in these limiting characteristics would return the ruby laser to a competitive position in both old and new commercial and industrial applications.

Shortly after the demonstration of the first pulsed ruby laser, an attempt was made to achieve continuous wave operation of the ruby laser, wherein the pulsed flashlamp pump was replaced with a continuously emitting mercury arc lamp. Pure continuous wave emission from this ruby laser was not realized; rather it emitted a sequence of pulses at the low efficiency of 0.1%. Nonetheless, this type of ruby laser was the first laser to be used in medicine, for treatments such as tattoo removal, scar treatments, and to induce healing. Due to its limits in output power, lack of wavelength tunability, very low efficiency and associated large cooling demands, this type of ruby laser was quickly replaced with more versatile dye, Nd:YAG and argon lasers.

Notwithstanding these prior art ruby laser performance deficiencies, it is important to note that the ruby laser gain crystal has extremely robust bulk optical and thermo-mechanical properties, and possesses the relatively long, upper laser level energy storage lifetime of 3 milliseconds. These characteristics are of great importance in the practical realization of cost-effective solid-state lasers delivering high energy multi-joule pulses and at high average power. These attractive properties of the ruby gain crystal would be substantially exploited in modern laser based applications were a new cost-effective means of efficiently pumping both pulsed and CW ruby lasers introduced.

Figure 3:
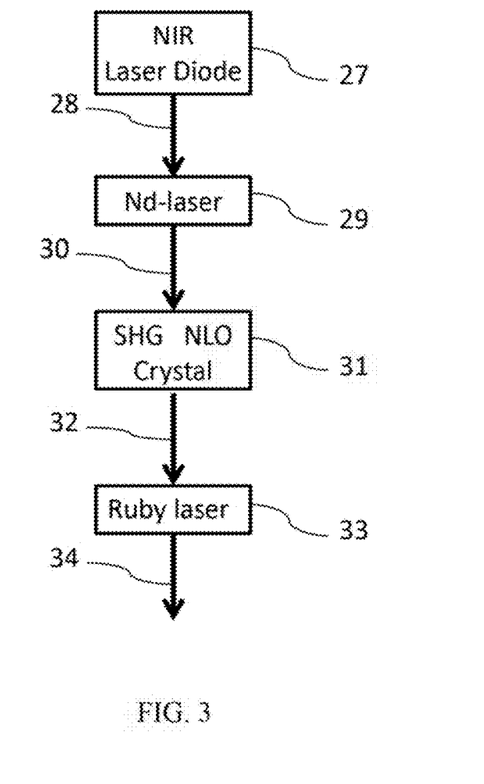
FIG. 3 is a block diagram of a prior art continuous wave ruby laser, pumped with a frequency doubled, near infrared laser diode pump neodymium solid state laser.

Pure continuous wave operation of a ruby laser was commercially introduced a few years ago by pumping its ruby gain crystal at ~532 nm in ruby's broad green absorption band. The pump source in this product is a neodymium doped solid state laser, pumped by ~808 nm near infrared laser diodes, and whose radiation output at a wavelength of ~1.064 nm is converted to radiation at a wavelength of ~532 nm using the nonlinear process of second harmonic generation (SHG). FIG. 3 shows a schematic block diagram of this prior art. Continuous wave near infrared laser diode 27 produces pump beam 28 and pumps Nd-laser 29 which in turn emits laser beam 30 at a wavelength of ~1064 nm. This beam passes through phase-matched NLO crystal 31 producing wavelength converted beam 32 at a wavelength of ~532 nm; which, in turn, is used to pump ruby laser 33 generating continuous wave output laser beam 34 at a wavelength of 694.3 nm. While achieving pure continuous wave operation of a ruby laser at 694.3 nm, this type of 532 nm pump source is complex mid expensive. A less complicated and more cost-effective form of ruby pump source pumping would significantly enhance the practical utility of ruby lasers.

The prior art pump source type of FIG. 3 also has an additional economic deficiency if utilized in pumping a Q-switched ruby laser to achieve high energy pulses at a wavelength of ~694 nm. The Nd laser gain medium typically has an energy storage lifetime of a few hundred microseconds, and so the near infrared laser diode pump source must deliver its pumping energy to the Nd gain element in a time shorter than this lifetime. Since a semiconductor laser diode is inherently a constant power radiation source, this limitation on pump pulse duration translates to a significant limitation on the amount of pump energy a given semiconductor laser diode can provide during that pulse duration. The generation of more pump pulse energy during the energy storage lifetime of the gain crystal then requires the purchase and use of more pump semiconductor laser diodes, significantly increasing the marginal cost of the Nd-DPSSL. Thus, it would be economically advantageous and less complex to replace due entire ~532 nm pump system disclosed in FIG. 3 with a semiconductor laser diode source capable of directly pumping the ruby gain crystal, taking advantage of ~10 times longer energy-storage lifetime of ruby (3 milliseconds), compared to that of an Nd gain crystal.

There are many commercial materials processing applications requiring the use of lasers emitting at deep ultraviolet (DUV) wavelengths, here defined as radiation with a wavelength <360 nm. These applications include, but are not limited to, scribing, drilling, marking, 3-D additive manufacturing, lithographic resist exposure, ablation, and curing. Many of these applications require the delivery of high peak power pulses with pulse durations of ~10 to ~100 nanoseconds. The neodymium, diode-pumped solid-state laser (Nd-DPSSL), emitting at a fundamental wavelength of ~1064 nm, is common to many laser systems producing industrially useful pulsed DUV laser radiation at wavelengths of ~355 nm, ~266 nm, and 213 nm. Radiation at these wavelengths is achieved by converting the Nd-DPSSL's output radiation at the fundamental wavelength of ~1064 nm to radiation with third, fourth, and fifth harmonic wavelengths, respectively, of ~355 nm, ~266 nm, and ~213 nm, by employing one or more stages of harmonic generation and or mixing in nonlinear optical crystals (NLO), as is well known in the art.

Consider in more detail the example of producing ~355 nm DUV radiation by tripling the ~1064 nm radiation from a Nd DPSSL. Two NLO crystals and associated optics are needed to produce radiation at a wavelength of 355 nm, specifically one NLO crystal to generate SGH radiation at a wavelength of ~532 nm, and a second NLO crystal to add together the photon energies of radiation at wavelengths of 532 nm and ~1064 nm. In general, the more NLO crystals and associated optics that are needed to generate radiation at a desired DUV wavelength, the more complex. Inefficient, operationally fragile, and costly the laser will be. Thus, there would be a premium on employing a ruby laser as the drive laser to generate DUV laser sources.

It is desirable to provide a ruby laser that overcomes the above described limitations and deficiencies of the prior art.

SUMMARY OF THE INVENTION

To overcome the above-mentioned limitations and deficiencies of the prior art ~1064 nm Nd:DPSSLs based laser systems, embodiments of the present invention include a DPSSL (diode pumped solid state laser) comprising: 1) a ruby crystal ($Cr^{3+}:Al_2O_3$ or $Cr^{3+}$:sapphire) serving at the optical gain and energy storage medium, and 2) a high bandgap semiconductor laser diode (LD) or LED pump source. Here, a high-bandgap semiconductor LD or LED is a semiconductor device whose-chemical composition is chosen to provide output radiation at an approximate wavelength of ~405 nm. The ruby crystal produces laser output at the relatively short wavelength of ~694 nm, and provides an energy storage lifetime of more than 3 msec (>10 times longer than that of neodymium doped laser crystals). The ruby laser crystal manifests spectroscopic properties allowing for the direct (not needing nonlinear wavelength conversion), efficient and practical pumping of ~694 nm laser action using powerful and efficient high bandgap semiconductor laser diodes or LEDs, and also possesses superior thermal, optical, and mechanical characteristics to those of YAG or $YVO_4$ often used in Nd:DPSSLs.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

A ruby laser that is directly pumped with a high bandgap semiconductor laser diode or LED is disclosed. The descriptor "bandgap" refers to the difference (or gap) in energy between the top of the valance band and the bottom of the conduction band of the semiconductor material from which a laser diode or LED is fashioned; the specific descriptor "high" bandgap used herein, refers to the class of semiconductors whose lattice anions are nitrogen ions, and are generally referred to as "nitride" or "GaN" semiconductors. Nitride based laser diodes and LEDs have bandgap energies that fall in the range of ~3.5 eV to 2.3 eV (corresponding to devices that emit near UV and visible wavelengths in the range of ~365 nm to ~530 nm) depending on the relative amount of Al, Ga, and In incorporated into the nitride semiconductor device layers. This high bandgap class of semiconductors is distinct from the (legacy) class of semiconductors whose lattice anions are arsenic ions, and are generally referred to as "arsenide" or "GaAs" semiconductors. Arsenide based laser diodes and LEDs have lower bandgap energies that fall in the range of 2.0 eV to 0.75 eV (corresponding to emitted device infrared wavelengths of ~750 nm to ~1250 nm), depending on the relative amount of Al, Ga, and in incorporated into the arsenide semiconductor device layers.

Figure 4:
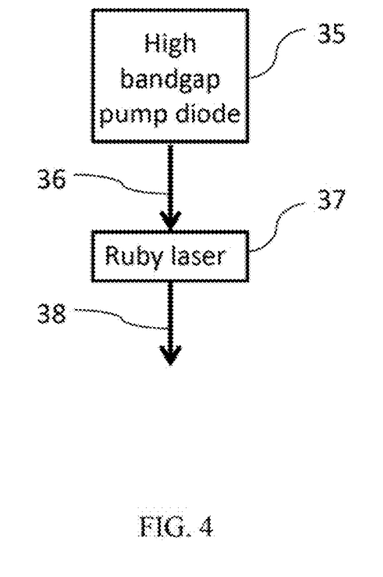
FIG. 4 is a block diagrams of a ruby laser directly pumped by a high bandgap GaN semiconductor laser diode.

FIG. 4 shows a functional block diagram of an embodiment of the present invention, where a high bandgap GaN semiconductor diode 35 produces pump beam 36 that pumps ruby laser 37 that, in turn, generates laser output beam 38 at a wavelength ~694 nm. The disclosed laser of FIG. 4 may be operated in any of the known temporal modalities, continuous wave, quasi-CW, repetitively pulsed, Q-switched and mode-locked, applying techniques well known in the art. The system described in FIG. 4 is presented as a non-limiting example.

Figure 5:
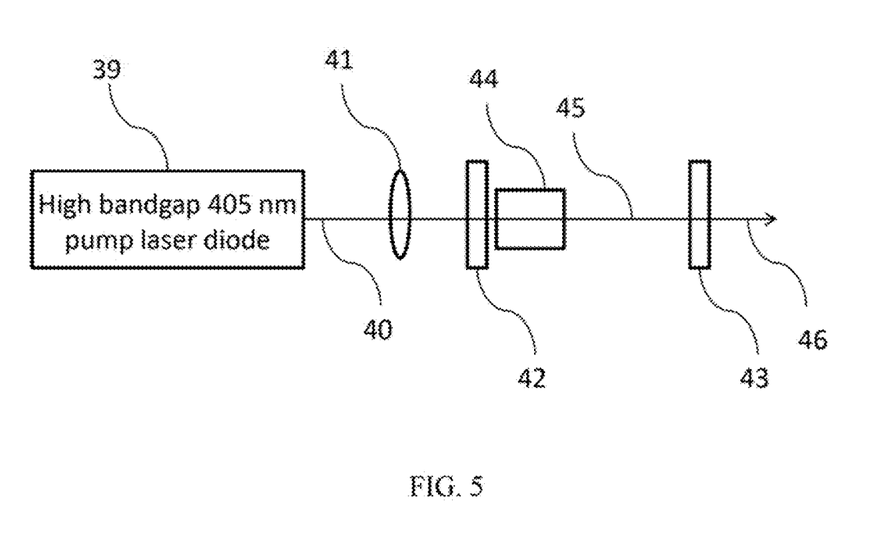
FIG. 5 shows an optical configuration of a CW or QCW ruby laser directly pumped by a high bandgap GaN semiconductor laser diode emitting at a wavelength of ~405 nm.

FIG. 5 shows the optical configuration of an embodiment of the present invention, where the high bandgap semiconductor laser diode 39 is specifically fashioned to emit a pure continuous wave at a wavelength of ~405 nm. In this configuration, high bandgap semiconductor laser diode 39 emitting in a continuous wave at a wavelength of ~405 nm generates continuous wave pump beam 40 that passes through pump beam coupling optics 41 and enters the optical cavity formed by end mirrors 42 and 43. Those skilled in the art, based on this disclosure, will recognize that other optical configurations can be utilized to direct beam 40 through mirror 42 to directly optically pump Ruby crystal 44. Such other optical configurations axe within the scope of the present invention. Ruby gain crystal 44 is contained in this optical cavity. Optical cavity end mirror 42 is a coated mirror that substantially transmits the ~405 nm wavelength pump beam and highly reflects radiation at a wavelength of ~694 nm. Optical cavity end mirror 43 is a partially transmitting mirror at a wavelength of ~694 nm. The continuously pumped ruby gain crystal 44 emits stimulated emission beam 45 at a wavelength of ~694 nm within the optical cavity, giving rise to continuous wave output laser beam 46 at a wavelength of ~694 nm. Those skilled in the art, based on this disclosure, will recognize that, in addition to coupling optics 41, other optical configurations can be utilized to direct beam 40 through mirror 42 to directly optically pump Ruby crystal 44. For purposes of this disclosure, coupling optics 41 and such other optical configurations referred to above, including directly optically pumping the crystal without intervening optics between the laser 39 and mirror 42, are within the scope of the present invention and are considered to be means for directly pumping the ruby crystal gain element 44. Further, the system described in FIG. 5 is presented as a non-limiting example.

Figure 6:
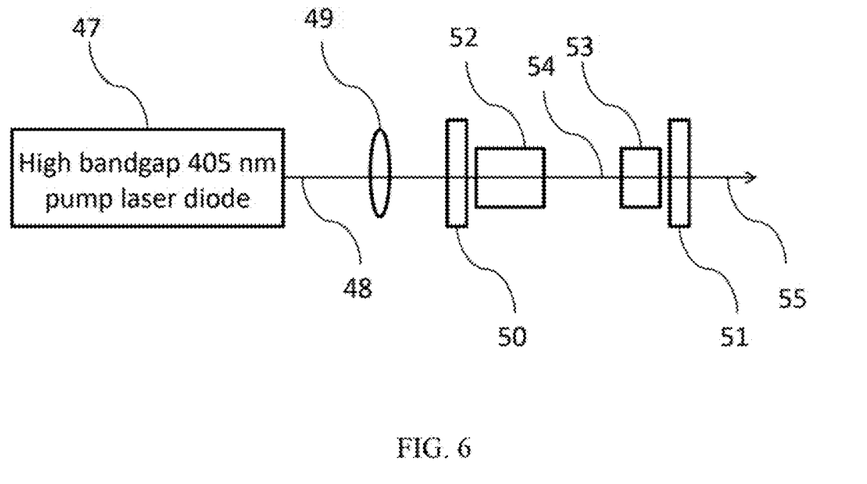
FIG. 6 shows an optical configuration of a Q-switched ruby laser directly pumped by a high bandgap GaN semiconductor laser diode emitting at a wavelength of ~405 nm.

FIG. 6 shows the optical configuration of another embodiment of the present invention in which the output of the ruby laser is a Q-switched pulse at a wavelength of 694.3 nm. This embodiment employs a high bandgap semiconductor laser diode specifically fashioned to emit at a wavelength of ~405 nm and operated in a so-called quasi-continuous-wave or QCW pulse mode. As used here, the QCW pump pulse produces a nominally constant power for a time duration the order of the energy storage lifetime of the gain medium being pumped, for ruby in the multi-millisecond range. In this embodiment, high bandgap semiconductor laser diode 47 emitting in the QCW pulse mode at a wavelength of ~405 nm generates a pump beam 48 of ~multi-millisecond pulse duration that passes through pump beam coupling optics 49 and enters the optical cavity formed by end mirrors 50 and 51. Ruby gain crystal 52 is contained in this optical cavity. Optical cavity end mirror 50 is a coated mirror that substantially transmits the ~405 nm QCW pump beam 48 and highly reflects radiation at a wavelength of ~694 nm. Optical cavity end mirror 51 is a partially transmitting mirror at a wavelength of ~694 nm. At the beginning of the QCW pump pulse, the Q-switch 53 is set to contribute a high optical loss at a wavelength of ~694 nm to the optical cavity. During the duration of the QCW pulsed pump pulse, the ruby gain crystal 52 integrates and stores pump energy supplied by the pomp pulse to establish a population inversion at a wavelength of ~694 nm. At the end of the QCW pump pulse duration, the Q-switch 53 is quickly switched to a low optical loss condition, initiating the buildup of stimulated emission beam 54 at a wavelength of ~694 nm within the optical cavity, giving rise to Q-switched output laser beam 55 at a wavelength of ~694 nm. Those skilled in the art, based on this disclosure, will recognize that, in addition to coupling optics 48, other optical configurations can be utilized to direct beam 48 through mirror 50 to directly optically pump Ruby crystal 52. For purposes of this disclosure, coupling optics 49 and such other optical configurations referred to above, including directly optically pumping the crystal without intervening optics between the laser 47 and mirror 49, are within the scope of the present invention and are considered to be means for directly pumping the ruby crystal gain element 52. Further, the system described in FIG. 5 is presented as a non-limiting example.

A variant of this embodiment renders the waveform of the output of the ruby laser as a sequence of mode-lock pulses with durations of a few picoseconds, obtained when the Q-switch 53 of FIG. 6 is replaced by a suitable saturable absorber, as known in the art.

Two additional embodiments of the present invention replace the high bandgap semiconductor laser diode emitting at a wavelength of ~405 nm in the two embodiments of FIGS. 5 and 6, with high bandgap semiconductor laser diodes emitting in the green spectral region at a wavelength lying with the spectral breath of the broad green absorption band of ruby (see FIG. 2). When pumped at such a green wavelength, the quantum energy defect between pump and ruby laser photon energies is significantly reduced compared to that when a ~405 nm pump wavelength is utilized. However, at present the wall plug efficiency of ~530 nm green emitting high bandgap semiconductor laser is about 6%, and even much lower at the peak ruby absorption wavelength of ~560 nm. In future, should the efficiency performance of green high bandgap semiconductor laser diodes be increased sufficiently, these additional embodiments may become more desirable than at present.

Figure 7:
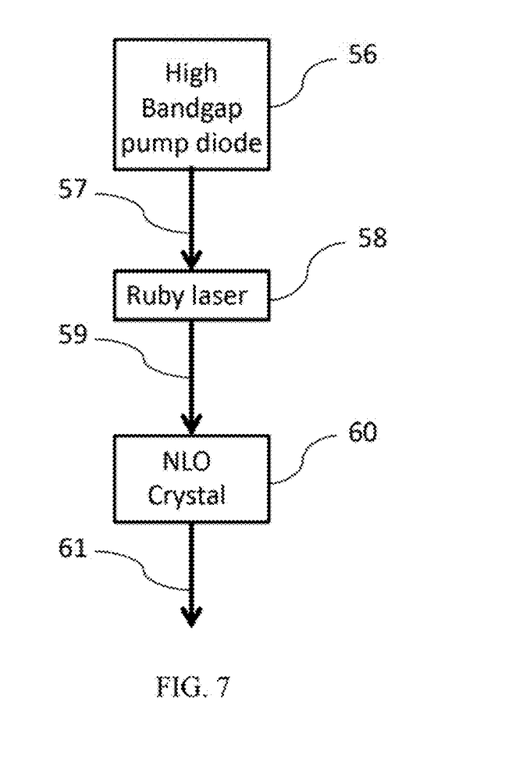
FIG. 7 is a block diagram of a source of pulsed DUV radiation at a wavelength of ~347 nm produced by second harmonic nonlinear conversion of a ruby laser that is directly pumped by a high bandgap GaN semiconductor laser diode emitting at a wavelength of ~405 nm.

FIG. 7 shows a block diagram of the incorporation of the ruby laser embodiments of FIGS. 5 and 6 into a DUV laser system emitting radiation at a wavelength of ~347 nm, generated by second harmonic conversion of the output radiation at a wavelength of ~694 nm of a ruby laser of the embodiments of FIGS. 5 and 6 described above. In FIG. 7, high bandgap pump diode 56, pump diode beam 57, ruby laser 58 and ruby output beam 59 at a wavelength of ~694 nm collectively represents the embodiments of FIGS. 5 and 6. The ruby laser output beam 59 is passed, in one embodiment, through a single NLO crystal 60 that, is phase matched to efficiently produce DUV output radiation beam 61 at a wavelength of ~347 nm. In an alternate embodiment, crystal 60 comprises at least two non-linear optic (NLO) crystals that are cascade phase matched at a wavelength of ~231 nm. In another embodiment, crystal 60 comprises at least three non-linear optic (NLO) crystals that are cascade phase matched at a wavelength of ~173 nm.

Figure 8:
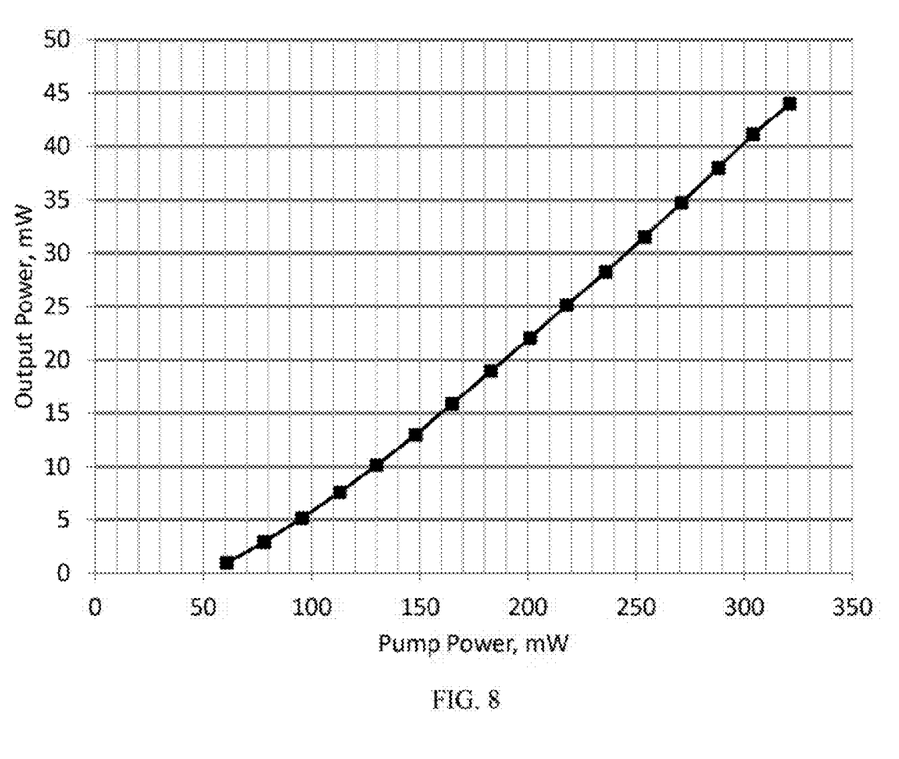
FIG. 8 shows the measured continuous wave, CW, output power versus continuous wave pump power, of a ruby laser directly pumped by a high bandgap GaN laser diode continuously emitting pump radiation at a wavelength of ~405 nm.

A ruby laser of the embodiment of FIG. 5 has been constructed and operated. Referring to FIG. 5, the high bandgap semiconductor laser diode 39 is a Nichia NDV4B16 laser diode emitting 300 mW at a wavelength of ~405 nm in a single spatial mode. Ruby laser crystal 44 is a rectangular parallel piped with a crystal thickness of 5 mm, doped with 0.05% $Cr_2O_3$. Optical cavity mirror 42 is a flat mirror with high transmission at a wavelength of ~405 nm and high reflectivity at a wavelength of ~694 nm. Optical cavity mirror 43 is a concave mirror with a 50 mm radius of curvature. The cavity mirrors are positioned to form a hemispherical optical cavity. FIG. 8 shows the achieved output power at a wavelength of ~694 nm as a function of the pump laser diode pump power at a wavelength of ~405 nm. The reflectivity of the output coupler mirror 43 used to obtain this performance was 95%. The output quantum slope efficiency is 27%, the power slope efficiency is 15%, and the optical-optical power conversion efficiency is greater than 10%. This test data confirms the efficacy of the disclosed ruby laser and validates that the disclose ruby laser may also be beneficially used construct various DUV sources described above.

As a further discussion of the manner of usage and operation of the present invention, the same should be apparent from the above description, to include variations in size, materials, shape, form, function and manner of operation, assembly and use, are deemed readily apparent and obvious to one skilled in the art, and all equivalent relationships to those illustrated in the drawings and describer in the specification are intended to be encompassed by the present invention.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

I claim:

1. An apparatus, comprising:
    a high bandgap semiconductor source of electromagnetic radiation, wherein said source comprises an array of semiconductor laser diodes;
    a ruby crystal gain element contained within an optical cavity resonant at a wavelength of ~694 nm; and
    means for directly pumping said ruby crystal gain element with said electromagnetic radiation to produce an output beam having said wavelength of ~694 nm.

2. The apparatus of claim 1, wherein said electromagnetic radiation comprises continuous wave radiation.

3. The apparatus of claim 1, wherein said electromagnetic radiation comprises QCW pulsed radiation.

4. The apparatus of claim 1, wherein said electromagnetic radiation comprises a wavelength of ~405 nm.

5. The apparatus of claim 1, wherein said electromagnetic radiation comprises a wavelength of ~530 nm.

6. The apparatus of claim 3, further comprising a Q-switch operatively located within said optical cavity.

7. The apparatus of claim 3, further comprising a saturable absorber mode-locker operatively located within said optical cavity.

8. The apparatus of claim 1, further comprising a non-linear optic (NLO) crystal located outside of said cavity, wherein said NLO crystal is phase matched at said wavelength of ~694 nm and at a wavelength of ~347 nm; and
    means for coupling said output beam to said first NLO crystal.

9. The apparatus of claim 1, further comprising a non-linear optic (NLO) crystal located inside said cavity, wherein said NLO crystal is phase matched at said wavelength of ~694 nm and at a wavelength of ~347 nm.

10. The apparatus of claim 3, wherein each QCW pulse of said pulsed radiation has a pulse duration in the range from 0.1 millisecond to 5 milliseconds.

11. The apparatus of claim 7, wherein said output beam is a sequence of mode-lock pulses, wherein each pulse of said mode-locked pulses has a pulse duration within a range from 1 picosecond to 100 picoseconds.

12. A method, comprising:
    producing electromagnetic radiation from a high bandgap semiconductor source of electromagnetic radiation, wherein said source comprises an array of semiconductor laser diodes; and
    directly pumping a ruby crystal gain element with said electromagnetic radiation to produce an output beam having a wavelength of ~694 nm, wherein said ruby crystal gain element is contained within an optical cavity resonant at said wavelength of ~694 nm.

13. The method of claim 12, wherein said electromagnetic radiation comprises continuous wave radiation.

14. The method of claim 12, wherein said electromagnetic radiation comprises QCW pulsed radiation.

15. The method of claim 12, wherein said electromagnetic radiation comprises a wavelength of ~405 nm.

16. The method of claim 12, wherein said electromagnetic radiation comprises a wavelength of ~530 nm.

17. The method of claim 14, further comprising operatively locating a Q-switch within said optical cavity.

18. The method of claim 14, further comprising operatively locating a saturable absorber mode-locker within said optical cavity.

19. The method of claim 12, further comprising providing a non-linear optic (NLO) crystal outside of said cavity, wherein said NLO crystal is phase matched at said wavelength of ~694 nm and at a wavelength of ~347 nm; and
    coupling said output beam to said first NLO crystal.

20. The method of claim 12, further comprising providing a non-linear optic (NLO) crystal located inside said cavity, wherein said NLO crystal is phase matched at said wavelength of ~694 nm and at a wavelength of ~347 nm.

21. The method of claim 14, wherein each pulse of said QCW pulsed radiation has a pulse duration in the range from 0.1 millisecond to 5 milliseconds.

22. The method of claim 18, wherein said output beam is a sequence of mode-lock pulses, wherein each pulse of said mode-locked train of pulses has a pulse duration within a range of 1 picosecond to 100 picoseconds.

23. An apparatus, comprising:
    a high bandgap semiconductor source of electromagnetic radiation, wherein said electromagnetic radiation comprises QCW pulsed radiation;
    a ruby crystal gain element contained within an optical cavity resonant at a wavelength of ~694 nm; and
    means for directly pumping said ruby crystal gain element with said electromagnetic radiation to produce an output beam having said wavelength of ~694 nm.

24. An apparatus, comprising:
    a high bandgap semiconductor source of electromagnetic radiation;
    a ruby crystal gain element contained within an optical cavity resonant at a wavelength of ~694 nm;

means for directly pumping said ruby crystal gain element with said electromagnetic radiation to produce an output beam having said wavelength of ~694 nm;

a non-linear optic (NLO) crystal located outside of said cavity, wherein said NLO crystal is phase matched at said wavelength of ~694 nm and at a wavelength of ~347 nm; and means for coupling said output beam to said first NLO crystal.

25. An apparatus, comprising:

a high bandgap semiconductor source of electromagnetic radiation;

a ruby crystal gain element contained within an optical cavity resonant at a wavelength of ~694 nm;

means for directly pumping said ruby crystal gain element with said electromagnetic radiation to produce an output beam having said wavelength of ~694 nm; and a non-linear optic (NLO) crystal located inside said cavity, wherein said NLO crystal is phase matched at said wavelength of ~694 nm and at a wavelength of ~347 nm.

26. A method, comprising:

producing electromagnetic radiation from a high bandgap semiconductor source of electromagnetic radiation, wherein said electromagnetic radiation comprises QCW pulsed radiation; and directly pumping a ruby crystal gain element with said electromagnetic radiation to produce an output beam having a wavelength of ~694 nm, wherein said ruby crystal gain element is contained within an optical cavity resonant at said wavelength of ~694 nm.

27. A method, comprising:

producing electromagnetic radiation from a high bandgap semiconductor source of electromagnetic radiation;

directly pumping a ruby crystal gain element with said electromagnetic radiation to produce an output beam having a wavelength of ~694 nm, wherein said ruby crystal gain element is contained within an optical cavity resonant at said wavelength of ~694 nm;

a non-linear optic (NLO) crystal outside of said cavity, wherein said NLO crystal is phase matched at said wavelength of ~694 nm and at a wavelength of ~347 nm; and coupling said output beam to said first NLO crystal.

28. A method, comprising:

producing electromagnetic radiation from a high bandgap semiconductor source of electromagnetic radiation;

directly pumping a ruby crystal gain element with said electromagnetic radiation to produce an output beam having a wavelength of ~694 nm, wherein said ruby crystal gain element is contained within an optical cavity resonant at said wavelength of ~694 nm; and a non-linear optic (NLO) crystal located inside said cavity, wherein said NLO crystal is phase matched at said wavelength of ~594 nm and at a wavelength of ~347 nm.

* * * * *